(12) United States Patent
Taggart et al.

(10) Patent No.: US 7,304,373 B2
(45) Date of Patent: Dec. 4, 2007

(54) POWER DISTRIBUTION WITHIN A FOLDED FLEX PACKAGE METHOD AND APPARATUS

(75) Inventors: Brian Taggart, Phoenix, AZ (US); Robert M. Nickerson, Chandler, AZ (US); Ronald L. Spreitzer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 10/977,908

(22) Filed: Oct. 28, 2004

(65) Prior Publication Data

US 2006/0091508 A1     May 4, 2006

(51) Int. Cl.
*H01L 23/02* (2006.01)

(52) U.S. Cl. ............... 257/686; 174/254; 257/E23.177; 361/749

(58) Field of Classification Search ........ 257/691–692, 257/685, 686; 174/261–262, 266, 254; 439/67; 361/748, 750, 751, 752, 749
See application file for complete search history.

(56) References Cited

U.S. PATENT DOCUMENTS

| | | | | |
|---|---|---|---|---|
| 5,316,787 A | * | 5/1994 | Frankeny et al. | 216/19 |
| 6,444,921 B1 | * | 9/2002 | Wang et al. | 174/260 |
| 6,594,152 B2 | * | 7/2003 | Dent | 361/785 |

* cited by examiner

*Primary Examiner*—B. William Baumeister
*Assistant Examiner*—Dana Farahani
(74) *Attorney, Agent, or Firm*—Blakely, Sokoloff, Taylor & Zafman LLP

(57) ABSTRACT

A device includes a folded flex substrate. A memory die is connected to a first side of the folded flex substrate. A logic die is connected to a second side of the folded flex substrate. A trace routing pattern of source voltage signals is identical to a trace routing pattern of collector voltage signals.

18 Claims, 5 Drawing Sheets

POWER DISTRIBUTION WITHIN A FOLDED FLEX PACKAGE METHOD AND APPARATUS

BACKGROUND

1. Field

Embodiments relate to methods and apparatus for improved power distribution within a folded flex package and, in particular, to substrate design to enable even power distribution across a fold region.

2. Description of the Related Art

Electronic devices such as cellular telephones and notebook computers typically contain a number of integrated circuit (IC) packages mounted to a printed circuit board (PCB). IC packages typically include a single IC die (or chip) on a substrate or leadframe. The die and substrate are encapsulated in a material, such as plastic. The encapsulated packages are then mounted to another substrate, such as a PCB.

Multichip modules (MCM) are IC packages that can contain two or more integrated circuits. The size of the electronic device that uses MCMs can be reduced because MCMs typically have a number of individual IC dice mounted within a single package in a laterally adjacent manner. The outer dimensions of all the individual elements, however, limit the minimum footprint of a MCM.

Moreover, MCM substrates are typically constructed from ceramic, silicon, metal or printed circuit board materials that are relatively expensive to produce. Considerable effort has been expended to provide an electronic package that has a minimal footprint and volume and that can be assembled with conventional plastic injection molding techniques without adding expensive interconnecting substrate components.

FIG. 1 illustrates a design that attempts to decrease the footprint and volume of the IC package. Processing device 100 is a standard stacked chip scale package (SCSP) configuration. Processing device (e.g., IC package) 100 includes stacked IC dice, which include logic die 101 and memory die 102. The SCSPs are formed by stacking several sets of IC dice on a substrate, wire bonding, encapsulating the IC dice, and then slicing the substrate and encapsulant to separate each SCSP.

Processing device 100 includes conductive traces 114 on the top surface of the substrate. Vias are conductive interconnects that extend through the substrate to electrically connect traces 114 to conductive pads on the bottom surface of the substrate. One example of a substrate is a printed circuit board (PCB). Other examples of materials for the substrate are: flame retardant 4 (FR4), bismaleimide-triazine (BT), tape automated bonding (TAB) tape material, ceramic, silicon on sapphire (SOS), or a multi-layered substrate such as an organic land grid array (OLGA).

The SCSP processing device 100 shown in FIG. 1 is connected to a circuit board (not shown) by solder balls 118, which are placed on pads on the bottom surface of the substrate. Other types of IC packages may include leads that extend laterally with respect to the dice within the package for connection to an external circuit board. An adhesive, such as epoxy, is used to mount die 101 and die 102. After first die 101 and second die 102 are mounted, they are wire bonded to the substrate 105. First die 101 has bond pads on its top surface near its edges, and second die 102 has bond pads on its top surface near its edges. Bond wires connect the bond pads of first die 101 and second die 102 to substrate 105. The bond pads are connected by bond wires to bond fingers 240 (see FIG. 2).

FIG. 2 illustrates a layout for a folded flex substrate, such as the SCSP processing device 100 illustrated in FIG. 1. Folded flex substrate 200 includes a first area (portion) 210 where a memory die is to be placed. A second area (portion) 220 is where a logic die is to be placed. Fold region 230 is where the folded flex substrate is to be folded over. Folded flex substrate 200 also includes bond-fingers 240. Collector and source routing 250 are routed across the fold region.

For flex SCSP (FSCSP) package stack configurations, as illustrated in FIG. 3, power delivery through the fold region is very challenging. This stack configuration has a bottom portion as illustrated in FIGS. 1-2. The signal trace length is effectively doubled in a FSCSP package, which directly impacts power delivery inductive resistance (IR) drop. This in turn adversely impacts product performance. Device 300 in FIG. 3 includes first device 310 and second device 320 arranged in a stack configuration. Balls 310 are coupled to pads on a substrate. Vias extend through the substrate to electrically connect traces 314 to conductive pads on the bottom surface of the substrate.

The above described devices having current folded flex substrate design are prone to performance issues due to length of traces from a bottom solder ball in a ball grid array (BGA) to a top package interface. This results in power delivery horizontal IR drop between the respective power and ground buses.

BRIEF DESCRIPTION OF THE DRAWINGS

Embodiments are illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

The embodiments discussed herein generally relate to methods and apparatus for improved power distribution within a folded flex package. Referring to the figures, exemplary embodiments will now be described. The exemplary embodiments are provided to illustrate the embodiments and should not be construed as limiting the scope of the embodiments.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 1:
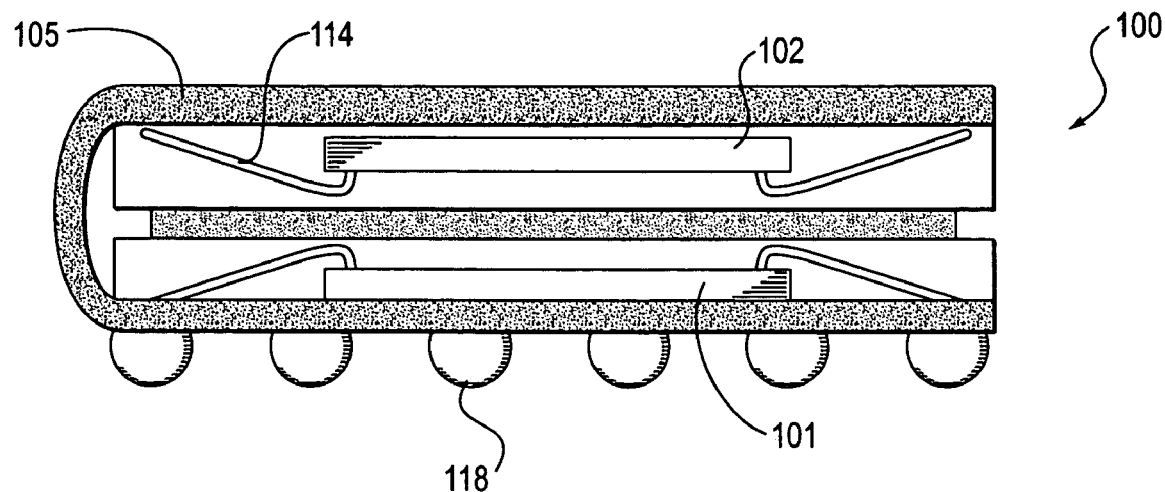
FIG. 1 illustrates a standard stacked chip scale package (SCSP) configuration.
Figure 3:
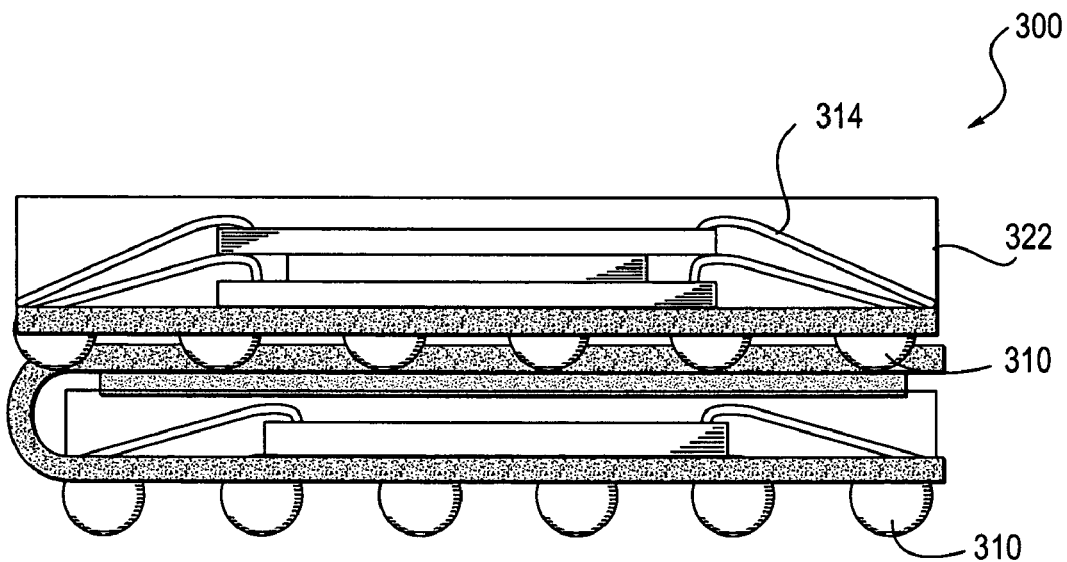
FIG. 3 illustrates another standard SCSP configuration.
Figure 2:
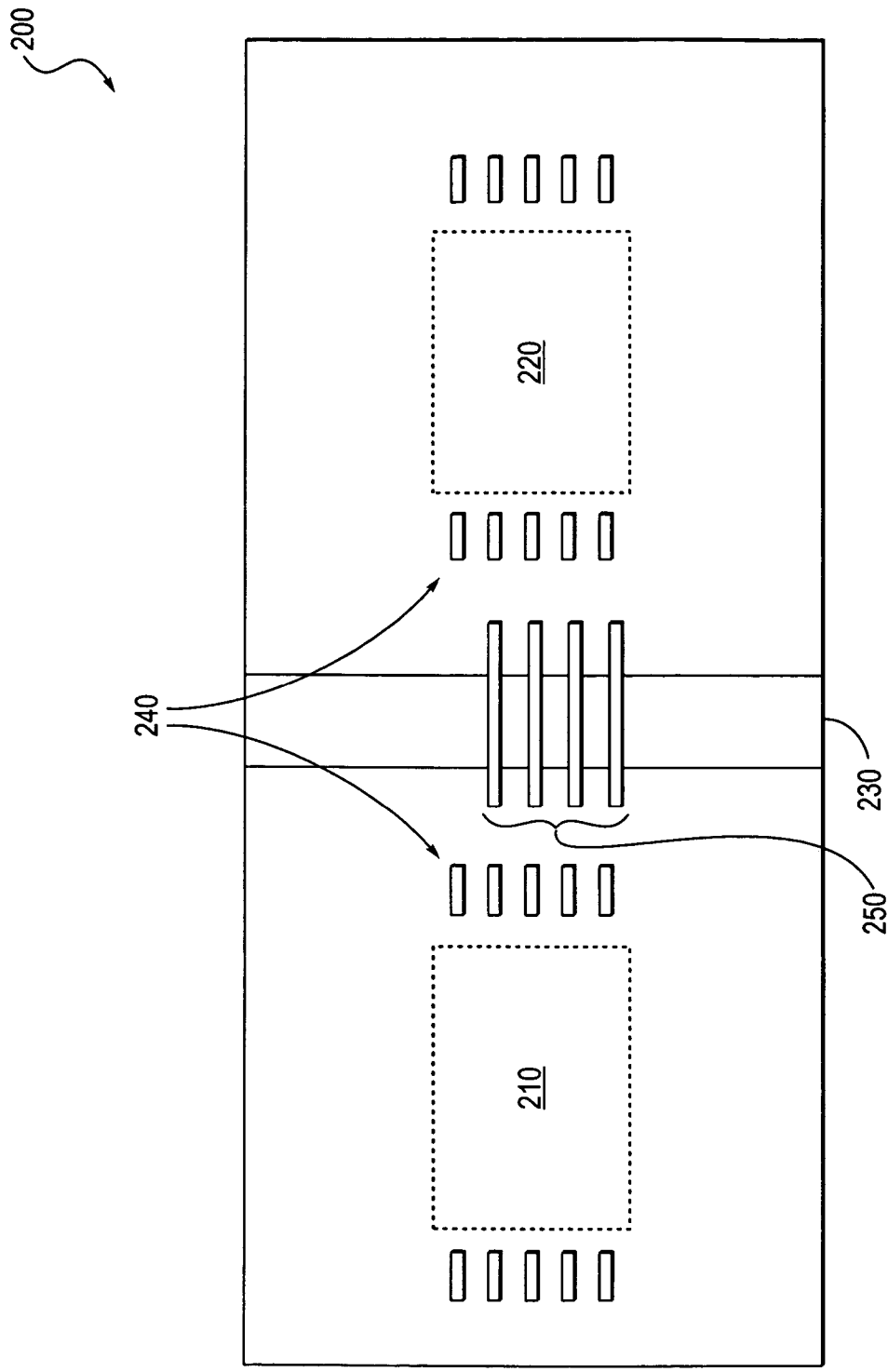
FIG. 2 illustrates a layout for the standard SCSP configuration illustrated in FIG. 1.
Figure 4:
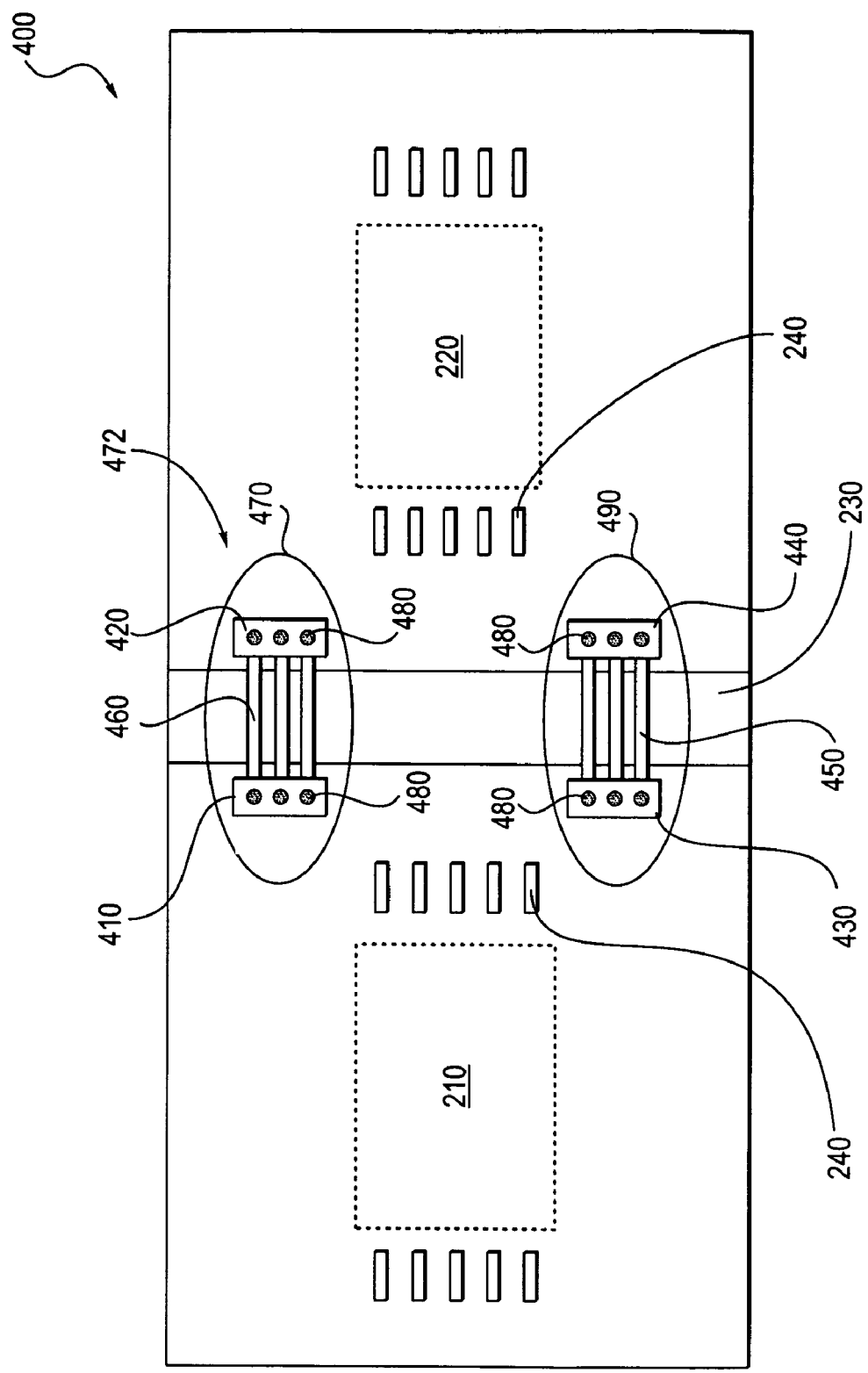
FIG. 4 illustrates an embodiment of a folded flex substrate layout with improved routing.

FIG. 4 illustrates an embodiment using a folded flex substrate having a thin multi-layer polyimide based substrate. The routing of folded flex substrate 400 is such that the source voltage (VSS) and the collector voltage (VCC) signals are separate coupled pairs within critical signal groups. This routing design improves current return paths. VSS and VCC signals are tied to islands routed on both first portion 210 and second portion 220 in a "mirror" fashion. Top and bottom mirrored routing is stitched together through vias 480 on each side of fold region 230 to reduce resistance and improve current flow.

Substrate 400 virtually eliminates the potential for voltage drop across fold region 230 by bundling VCC trace 450 and VSS trace 460 together on both sides of fold region 230, and using junction boxes at 410, 420, 430, and 440 at each side of fold region 230 to connect the VCC and VSS bundles. This results in continued delivery of uninterrupted power to the other side of fold region 230.

As illustrated in FIG. 4, VSS bundle 470 and VCC bundle 490 include an identical pattern on either side of fold region 230. Vias 480 route traces that are outside fold region 230 with traces inside of fold region 230.

Figure 5:
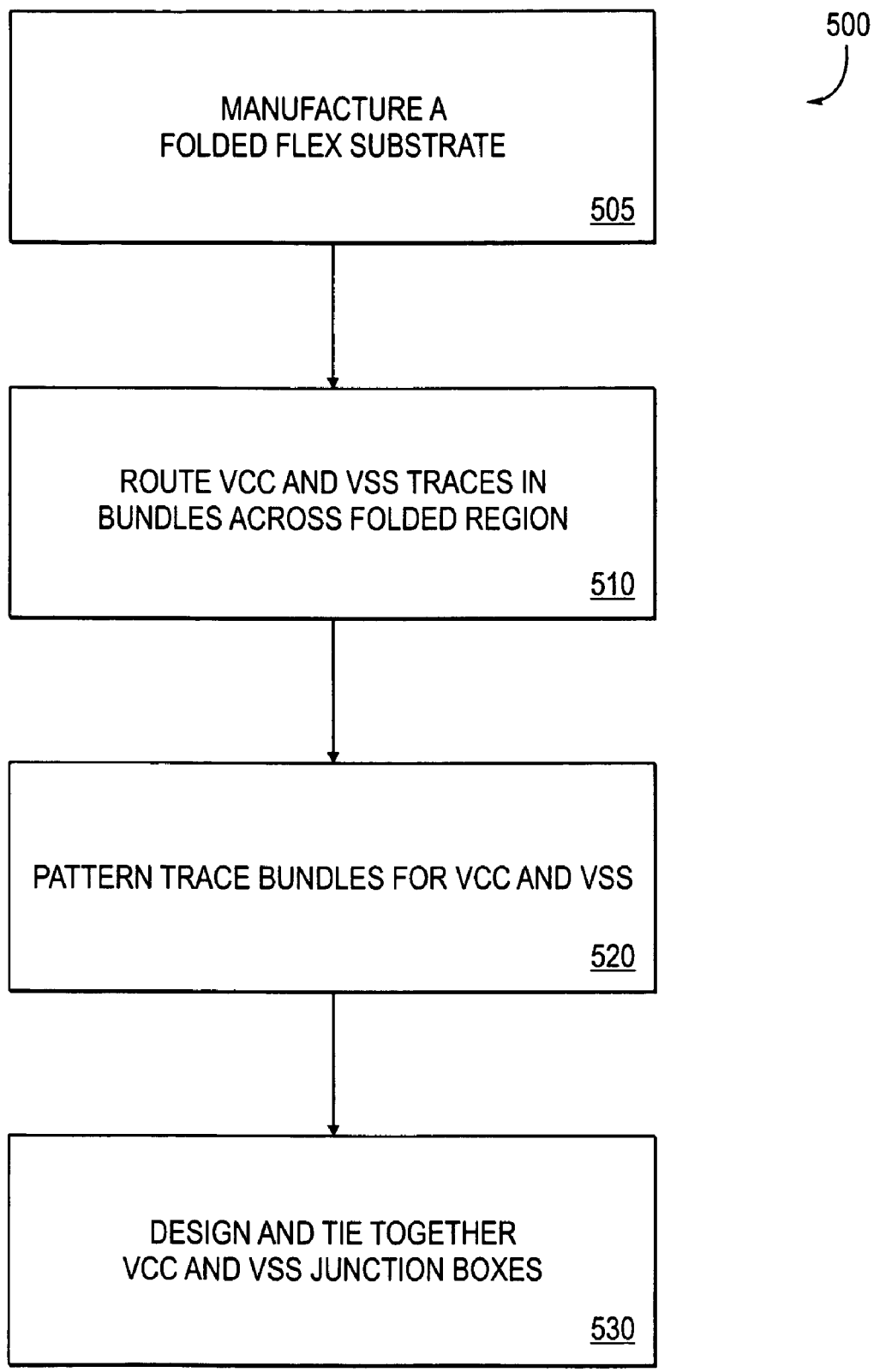
FIG. 5 illustrates a method of manufacturing an embodiment.

FIG. 5 illustrates a block diagram of a process for making an embodiment. Process 500 begins with block 505 where a folded flex substrate is manufactured per normal process flow for the given design rules. Typical techniques can be used in manufacturing the folded flex substrate. For example, metal may be plated onto the dielectric layers and etched to form the solder pads, routing traces, vias and land pads with known photolithography techniques; conductive epoxy can be inserted into the vias to connect input/output pads with the vias; the vias can be formed by laser drilling, mechanical drilling, etching or other techniques known in the art, etc.

In block 510 the folded flex substrate is routed such that VCC and VSS trace routings are bundled together at the fold regions. In block 520 VCC and VSS trace routings are bundled across the fold region with identical patterning on the outside and on the inside of the fold region. In block 530, the bundled traces are designed and made to tie together at junction boxes at each side of the fold region. Typical folding techniques are then carried out to create the FSCP device.

Figure 6:
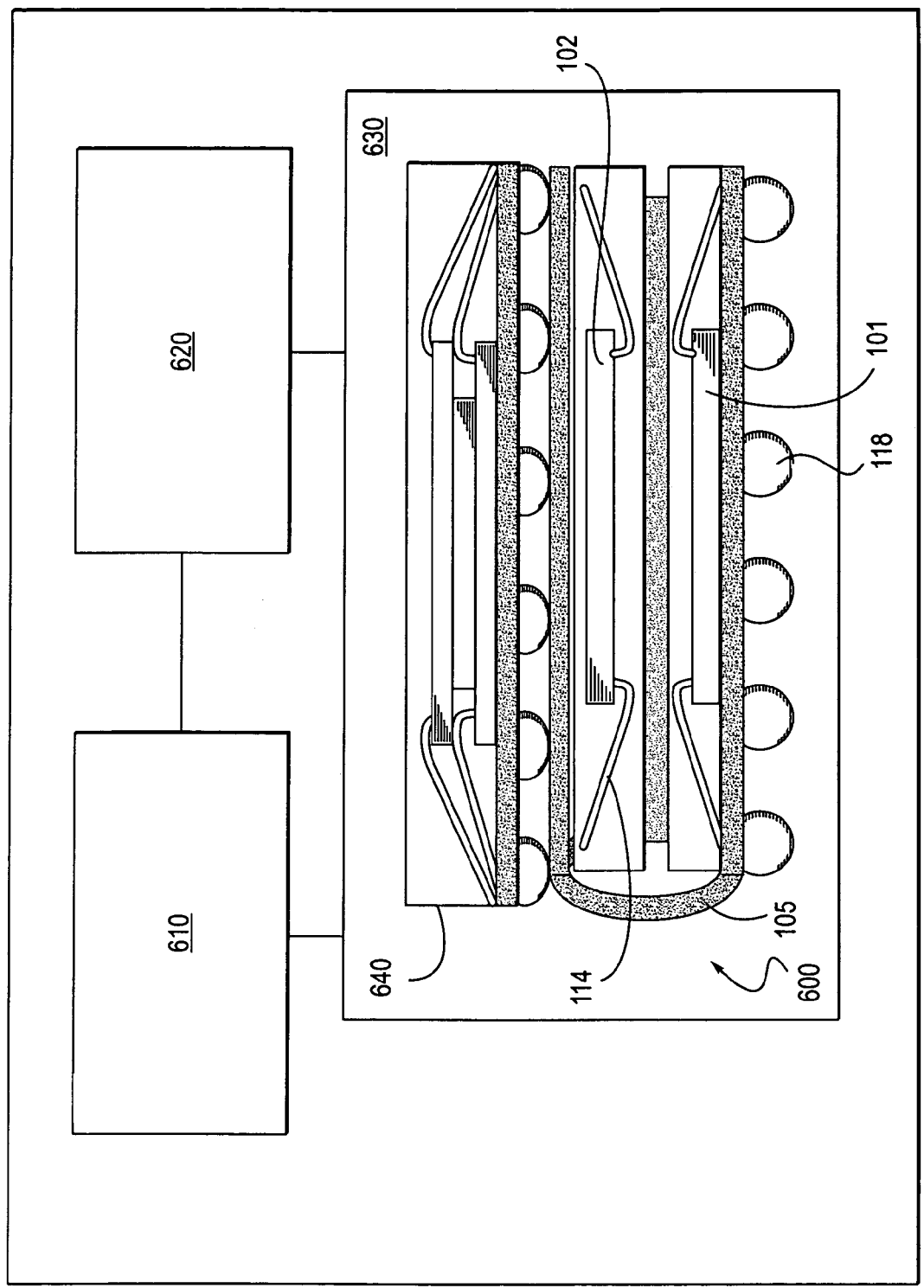
FIG. 6 illustrates an embodiment of a system.

FIG. 6 illustrates an embodiment of a system. System 600 includes memory device 620 connected to power supply 610. In one embodiment, memory device 620 can include one or more memory modules, such as random access memory (RAM), static RAM (SRAM), dynamic RAM (DRAM), synchronous DRAM (SDRAM), read-only memory (ROM), etc.

Power supply 610 can be any source of power, such as one or more batteries, a direct current (DC) voltage source, alternating current (AC) to DC adapter, etc. Device 630 is coupled to memory device 620 and power supply 610. Logic device 640 is connected to processing device 100. Processing device 100 and logic device 640 are connected power supply 610.

Processing device 100 includes a folded flex substrate. Logic die 101 is connected to folded flex substrate 105. Memory die 102 is connected to logic die 101. Folded flex substrate 105 includes first portion 210 and second portion 220. First portion 210 and second portion 220 are separated by fold region 230. Source voltage junction boxes 410 and 420 (i.e., pair of junction boxes) are routed together through first plurality of vias, such as vias 480. Collector voltage junction boxes (i.e., pair of junction boxes) are routed together through a second plurality of vias, such as vias 480.

Each source voltage junction box (i.e., 410 and 420) are oppositely disposed across fold region 230, and each collector voltage junction box (i.e., 430 and 440) are oppositely disposed across fold region 230. In one embodiment the source voltage junction boxes 410 and 420 are separated from the collector junction boxes 430 and 440 by a distance of either first portion 210 or second portion 220.

In one embodiment of system 600, a trace routing pattern of the pair of source voltage junction boxes (i.e., 410 and 420) is identical to a trace routing pattern of the pair of collector voltage junction boxes (i.e., 430 and 440). In one embodiment folded flex substrate 105 of processing device 100 includes many thin polyimide layers. In another embodiment bundled pairs of source voltage signals and bundled pairs of collector voltage signals deliver uninterrupted power across fold region 230.

With the above embodiments, the problem of previous routing designs are overcome and inductive resistance (IR) drop across the fold region is eliminated due to power being delivered uninterrupted across the fold region.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
a folded flex substrate having a first portion and a second portion, the first portion disposed on one side of a fold region, the second portion being disposed on another side of the fold region;
at least two source voltage junction boxes coupled to the folded flex substrate, the source voltage junction boxes are routed together through a first plurality of conductors;
at least two collector voltage junction boxes coupled to the folded flex substrate, the collector voltage junction boxes are routed together through a second plurality of conductors,
wherein the at least two source voltage junction boxes are oppositely disposed on different sides of the fold region, and the at least two collector voltage junction boxes are oppositely disposed on different sides of the fold region.

2. The apparatus of claim 1, wherein a trace routing pattern of the at least two source voltage junction boxes is identical to a trace routing pattern of the at least two collector voltage junction boxes.

3. The apparatus of claim 1, the folded flex substrate comprising a plurality of thin polyimide layers.

4. The apparatus of claim 1, wherein bundled pairs of source voltage signals and bundled pairs of collector voltage signals to deliver uninterrupted power across the fold region.

5. A system comprising:
a memory device;
a power supply coupled to the memory device;

a device, the device coupled to the power supply and the memory device, the device including a processing device having a folded flex substrate, the folded flex substrate including:
- a first portion and a second portion, the first portion and the second portion separated by a fold region;
- a pair of source voltage junction boxes routed together through a first plurality of conductors, and
- a pair of collector voltage junction boxes routed together through a second plurality of conductors.

6. The system of claim 5, the device including a logic device.

7. The system of claim 5, the processing device including a logic die coupled to the folded flex substrate, and
a memory die coupled to the logic die.

8. The system of claim 5, wherein each source voltage junction box of the pair of source voltage junction boxes are oppositely disposed across the fold region, and each collector voltage junction box of the pair of collector voltage junction boxes are oppositely disposed across the fold region.

9. The system of claim 5, wherein a trace routing pattern of the pair of source voltage junction boxes is identical to a trace routing pattern of the pair of collector voltage junction boxes.

10. The system of claim 5, the folded flex substrate further including a plurality of thin polyimide layers.

11. The system of claim 5, wherein bundled pairs of source voltage signals and bundled pairs of collector voltage signals to deliver uninterrupted power across the fold region.

12. An apparatus comprising:
- a folded flex substrate;
- a memory die coupled to a first side of the folded flex substrate;
- a logic die coupled to a second side of the folded flex substrate;
- a first source voltage junction box coupled to a first portion outside of a fold region of the folded flex substrate; and
- a first collector voltage junction box coupled to the first portion outside of the fold region,
- wherein a trace routing pattern of source voltage signals is identical to a trace routing pattern of collector voltage signals.

13. The apparatus of claim 12, further comprising:
a second source voltage junction box coupled to a second portion outside of the fold region; and
a second collector voltage junction box coupled to the second portion outside of the fold region.

14. The apparatus of claim 13, wherein the first source voltage junction box and the second source voltage junction box are routed together through a first plurality of vias.

15. The apparatus of claim 13, wherein the first collector voltage junction box and the second collector voltage junction box are routed together through a second plurality of vias.

16. The apparatus of claim 15, wherein the first side and the second side of the folded flex substrate are outside of the fold region.

17. The apparatus of claim 12, the folded flex substrate comprising a plurality of thin polyimide layers.

18. The apparatus of claim 12, wherein a plurality of bundled pairs of source voltage signals and a plurality of bundled pairs of collector voltage signals to deliver uninterrupted power across the fold region.

* * * * *